United States Patent [19]

Hemstreet et al.

[11] 4,011,011
[45] Mar. 8, 1977

[54] OPTICAL PROJECTION APPARATUS

[75] Inventors: Harold S. Hemstreet, Wilton; David A. Markle, Norwalk, both of Conn.; William H. Newell, Mount Vernon, N.Y.; Abe Offner, Darien, Conn.

[73] Assignee: The Perkin-Elmer Corporation, Norwalk, Conn.

[22] Filed: Dec. 19, 1974

[21] Appl. No.: 534,465

Related U.S. Application Data

[62] Division of Ser. No. 339,860, March 9, 1973, abandoned.

[52] U.S. Cl. .................................. 355/18; 355/8; 355/45; 355/51
[51] Int. Cl.² .......................................... G03B 27/32
[58] Field of Search ............. 355/8, 18, 50, 51, 75, 355/54, 55, 45; 350/55; 354/79

[56] References Cited

UNITED STATES PATENTS

| | | | |
|---|---|---|---|
| 3,052,155 | 9/1962 | Hurin et al. | 355/51 |
| 3,625,127 | 12/1971 | Tsuda | 355/45 X |
| 3,652,157 | 3/1972 | Blackert | 355/45 |
| 3,698,808 | 10/1972 | Delmas | 355/45 |
| 3,748,015 | 7/1973 | Offner | 350/199 |

*Primary Examiner*—Edna M. O'Connor
*Attorney, Agent, or Firm*—S. A. Giarratana; F. L. Masselle

[57] ABSTRACT

A unity magnification catoptric image-forming system and an illumination system on the one hand, and an object- and image-surface supporting means on the other hand, are arranged for relative movement to retain the object and image surfaces in unity magnification conjugate planes of the catoptric system while effecting a scanning-type exposure of successive portions of the image surface to successively illuminated portions of the object. Fine motion mechanisms permit accurate preliminary adjustment of the object- and image-receiving surfaces relative to each other while under visual examination with the aid of the catoptric image-forming system.

8 Claims, 10 Drawing Figures

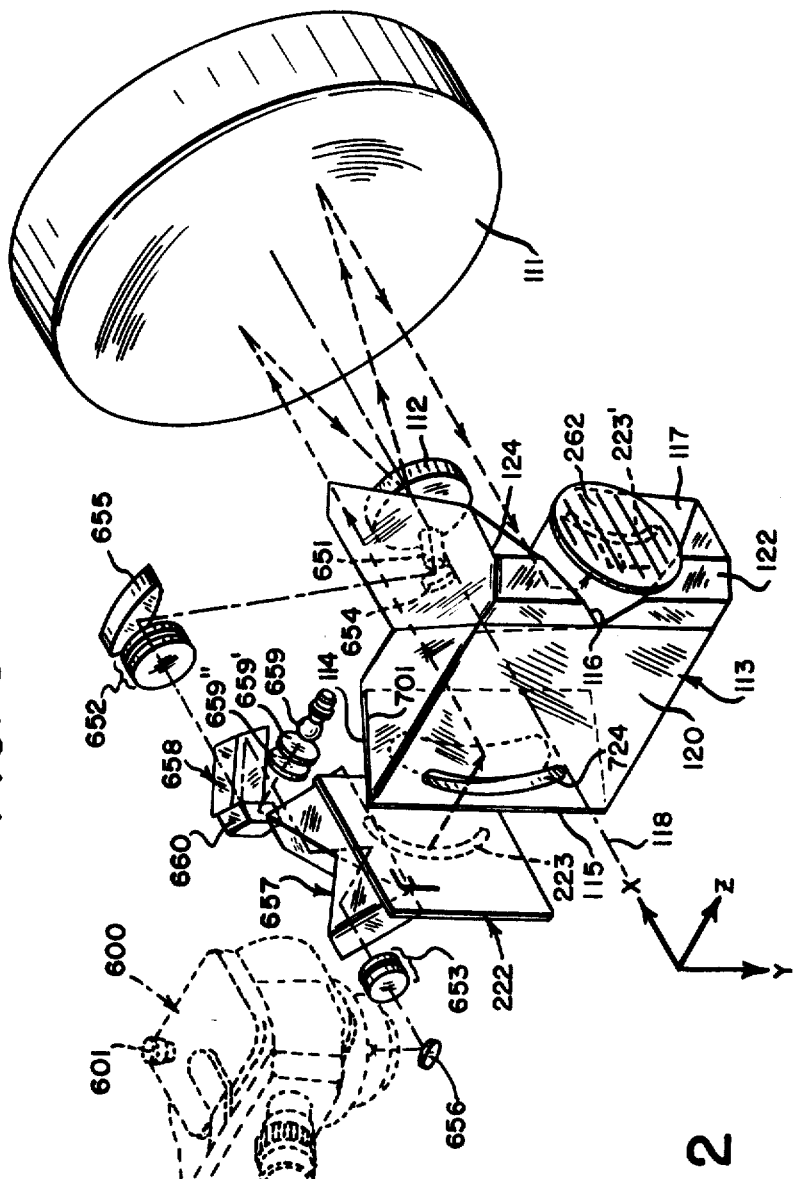
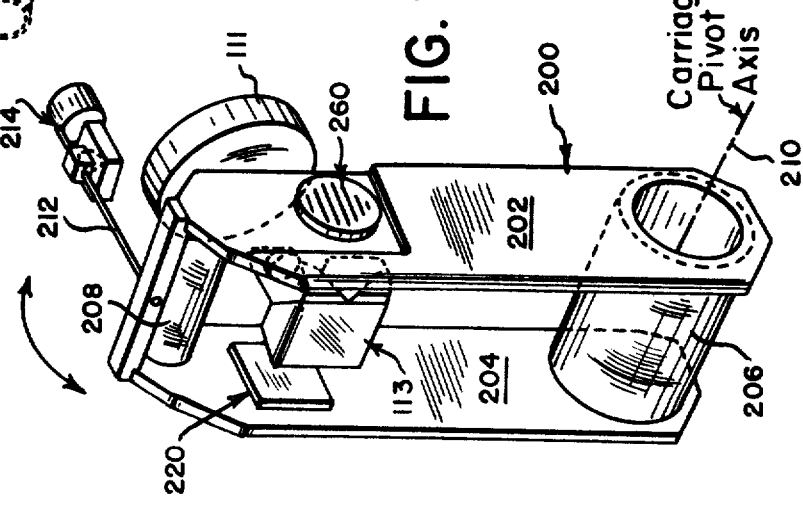

OPTICAL PROJECTION APPARATUS

BACKGROUND OF THE INVENTION

This is a Division of U.S. patent application Ser. No. 339,860 filed Mar. 9, 1973, now abandoned.

The present invention relates to photography in its broadest sense, and more particularly to an apparatus and method for exposing a light-sensitive oject to a succession of light images in closely controlled relative positions on the object.

In one application the invention finds use in the manufacture of so-called integrated circuits. These are typically small plates or "chips" of silicon on which a number of electric circuit elements, such as resistors, transistors, and leads therefor have been disposed or manufactured in situ, producing a plurality of interconnected circuit elements, i.e. a circuit. The chips may be very small, of linear dimensions of the order of millimeters, and the number of circuit elements may be large, of the order of scores or of hundreds. As one step in the manufacture of such integrated circuits, an oxidized wafer of silicon is coated with a photo-resist material. The wafer may be of such dimensions that after processing it may be cut, for example along rows and columns, into a large number of chips. When exposed to light, the photo-resist material polymerizes into a hard tenacious coating, whereas the unexposed portions of the layer are readily removed, for example by means of a solvent or developer. Photo-resist materials reacting in the opposite way are also available. By means of a "mask" or "master" which is opaque except for a pattern of transparent lines are areas therein through which light can pass, the photo-resist coating is exposed to light in a pattern conforming to a circuit element or elements to be produced (or to a part of such circuit), or to a photographic reverse thereof. The mask typically bears a multiplicity of the same pattern arranged in rows and columns. The mask may be laid against the wafer, much as in the making of the mask may be projected by imageforming means onto the surface of the wafer as in projection printing. After removal of the unexposed portion of the photo-resist layer, additional processing steps involving etching, doping and the like, not constituting part of the present invention, result in the formation of conductive leads and/or of semi-conductive circuit elements such as transistors or diodes, on the portion of the surface of the wafer from which the photo-resist coating has been removed. To form additional circuit elements or portions thereof, the process may be repeated by the laying down on the wafer of a new photo-resist coating and repetition of the steps just outlined. By means of a different mask, the wafer with the new photo-resist coating is exposed to a different light image for the polymerization of the photo-resist coating in a different pattern on its surface. The optical images formed on the wafer in the successive exposures must, however, be closely controlled in relative position.

Apparatus for performing the steps outlined in the preceding paragraph exists in the prior art. All such apparatus known to the present applicants are, however, subject to a number of disadvantaged. One is the fact that in such prior art apparatus wherein the mask and wafer are not in contact or substantially in contact with each other, there are employed projection lenses made up of refractive elements for imaging the complete mask on the wafer. These lenses are expensive and cumbersome, especially when, as is desirable, they are color corrected at two widely spaced wavelengths, one for purposes of alignment of the mask and the wafer, and the other for effecting exposure of the photo-resist coating.

BRIEF SUMMARY OF THE INVENTION

According to the invention an illumination source and an imaging system, preferably of catoptric type and preferably of unit magnification, are disposed in fixed relative position, and (for each exposure) the mask and wafer are supported in adjustably fixable relative position. A carriage supports one of these pairs of structural elements for motion with respect to the other so that the mask and wafer may be scanned, by motion parallel to their own planes, through conjugate planes of the imaging system. The source illuminates a selected area in the object plane of the imaging system where the latter possesses optimum imaging properties, and the motion of the carriage effects a scan of the mask through this illuminated area. In this way, a high quality image of a large mask is obtained on a large wafer, larger than that area of optimum imaging properties. By control of the speed of the scanning motion and/or of the width, parallel to the direction of that motion, of the area illuminated on the mask, control of exposure times is obtained. According to another feature of the invention, the imaging system includes a combination of plane mirrors which gives an image of the mask on the wafer in the same form as that which characterizes contact printing in photography. The imaging system is used in conjunction with additional optical elements to permit visual examination of the mask and wafer during alignment, the examination being effected with light which does not photographically expose the wafer.

DESCRIPTION OF THE DRAWINGS

The invention, including the features thereof abovementioned and others, will now be further described in terms of a presently preferred exemplary embodiment with reference to the accompanying drawings, in which:

FIG. 2 is a diagrammatic isometric view of the carriage which, in the machine of FIG. 1, supports the mask and wafer during the exposure or exposures, the carriage being shown in operative positional relation with the catoptric projection optical system by means of which an image of the mask is projected onto the wafer;

FIG. 3 is a diagrammatic view of the catoptric projection optical system, showing in addition the coarse viewing system by means of which the mask and wafer are initially positioned with respect to each other in the carriage;

DETAILED DESCRIPTION

Figure 1:
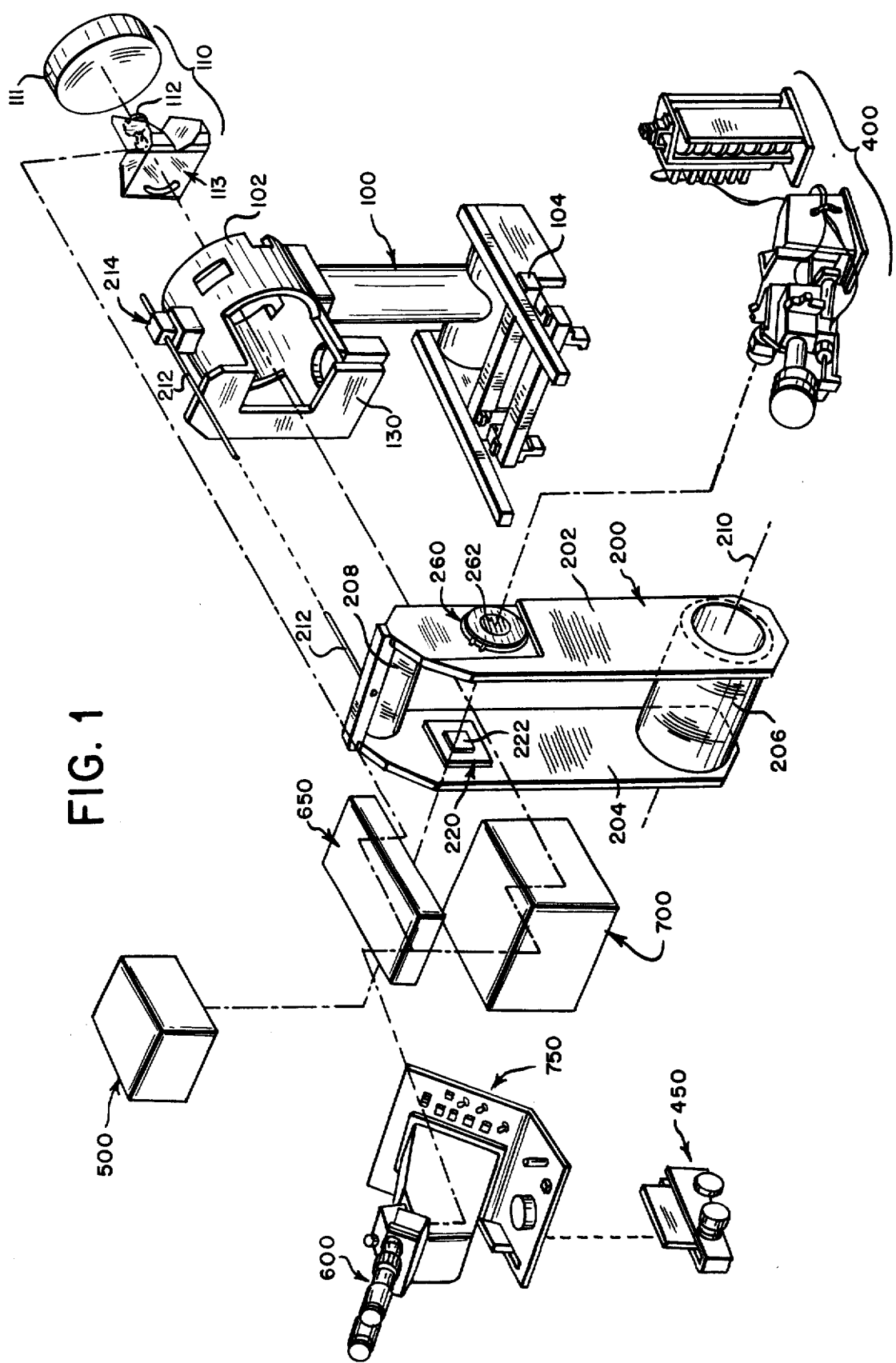
FIG. 1 is an exploded view of an optical projection and scanning machines in accordance with the invention, partly in block diagram form.

In FIG. 1 a machine in accordance with the invention is illustrated in exploded form. The machine includes a frame, not shown, in which the components seen in FIG. 1 are mounted, some fixedly and others movably. In particular, the machine incudes a stationary pedestal 100 having a generally cylindrical head 102 inside which is mounted a unity magnification catoptric image-forming system 110. Catoptric systems suitable for use in the apparatus of the present invention are the subject of U.S. Pat. No. 3,748,015 July 24, 1973 for Unit Power Imaging Catoptric Anastigmat.

The machine of FIG. 1 further includes a carriage 200 pivotally mounted on the pedestal 100 for rotation with respect thereto. The carriage supports the mask and wafer for a scanning motion together with respect to the image-forming system 100 and an illumination system 500 by means of which exposure is effected. The system 110 forms on the wafer an image of the portion of the mask defined by an illuminated slit which constitutes part of a stationary illumination system. The illumination system is diagrammatically illustrated in FIG. 1 at 500.

The carriage includes a mask stage 220 and a wafer stage 260 which are independently movable in finely controlled increments with respect to the carriage by means of rotational and translational mechanism disclosed and described in detail in copending patent application Ser No. 339,860, noted above.

The wafers are inserted in and removed from the stage 260 by means of a handling mechanism 400, the details of which constitute no necessary part of the present invention. The masks are similarly insertable into and removable from the mask stage 220 by mechanism of which a portion is diagrammatically indicated at 450 and the details of which again constitute no necessary part of the present invention.

Figure 5:
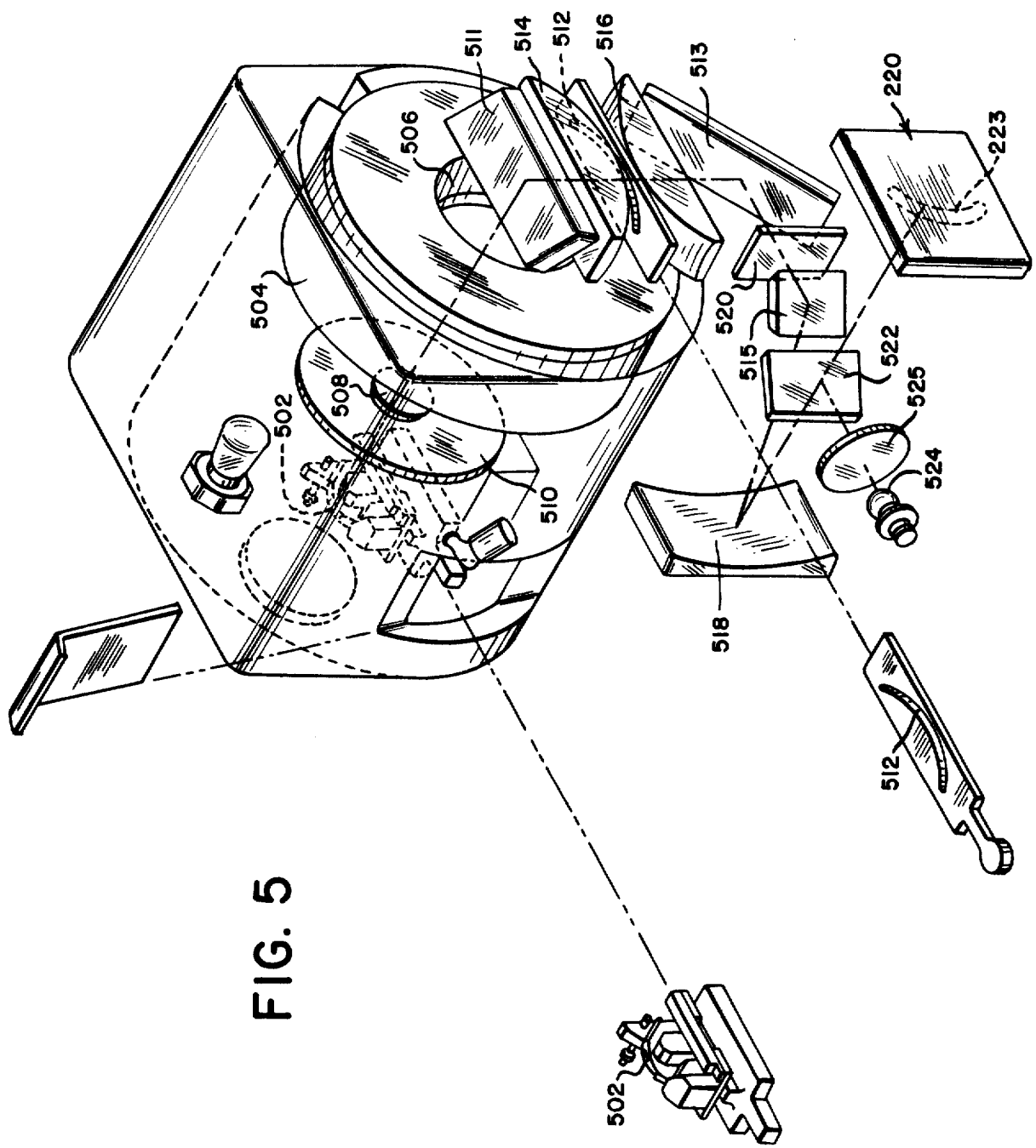
FIG. 5 is an isometric view of one form of illumination system which may be utilized in the machine of the invention for illuminating the mask.

The mask 222 in the stage 220 is illuminated by the illumination system 500, details of one suitable form of which are shown in FIG. 5. The illumination system also serves via the optical system 110 to illuminate the wafer 262 in the wafer stage 260, so as to permit correct positioning of the wafer with respect to the image of the mask projected onto it before the exposure is made. The actinically effective radiation for the exposure is in the ultraviolet and in the short wavelength portion of the visible, and the positioning is effected by means of visible light from which the actinic radiation has been removed.

To permit achievement of proper positioning of the mask and wafer in the carriage by means of their respective stages, the wafer and the image of the mask formed on the wafer by the optical system 110, are examined by optics which include the optical system 110 itself, a bionocular variable magnification microscope eyepiece 600, and certain additional elements, some of which are indicated diagrammatically in FIG. 1 at 650 and others at 700. The elements 650 and certain cooperating elements shown in FIG. 3 provide a relatively low magnification view of the mask and wafer, while the elements 700 permit a higher magnification view, as will be explained with reference to FIGS. 3 and 4.

CARRIAGE

Figure 8:
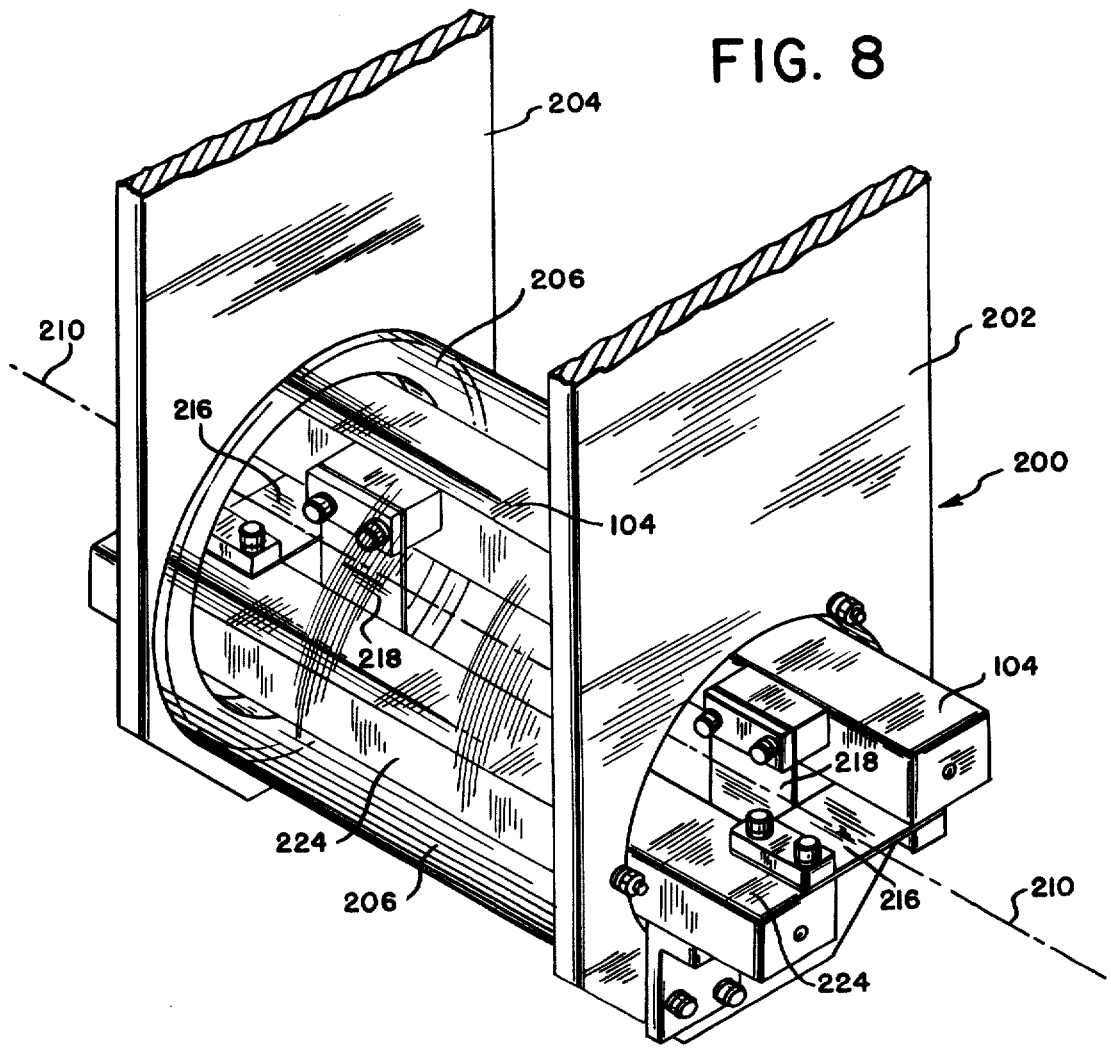
FIG. 8 is a fragmentary isometric view of the carriage of FIG. 1, illustrating a preferred flexure-type bearing support therefor.

Referring to FIGS. 2 and 8, the carriage includes two parallel metallic side plates 202 and 204 held together by means of glass cylinders 206 and 208. The carriage is mounted for arcuate rotation about a pivotal axis indicated at 210 which is located on or near the axis of the cylinder 206. The rotation is effected by means of a push rod 212 which connects to a friction drive mechanism 214 disposed on the cylindrical head 102. The friction drive mechanism, as well as the other movable portions of the machine involved in its operation, such as the mask and wafer stages 220 and 260 and the wafer and mask handling mechanisms 400 and 450, are under the control of an operator who has at his disposition the microscope eyepiece 600 and a set of associated controls indicated at a control panel 750 (FIG. 1).

The carriage is supported from a bar 104 on the pedestal 100 by means of two pairs of crossed flexure blades 216 and 218 (FIG. 8) which connect to a bar 224 affixed to the side plates of the carriage. The use of flexure-type supports on the carriage assists in obtaining accurate alignment of the axis of carriage rotation in parallelism with lines connecting points on the mask with their respective conjugate image points formed on the wafer by the optical system 110. Since only a relatively small angular motion is required of the carriage to carry the mask and wafer across the illuminated area defined by the illumination system, such flexure-type supports can be used.

The stages 220 and 260 support the mask and wafer over suitable apertures in the side plates 204 and 202 of the carriage.

The mask stage and motion mechanism and the wafer stage and motion mechanism as shown and described in detail in the above noted copending patent application Ser. No. 339,860 with respect to FIGS. 9 through 16 thereof.

ILLUMINATION SYSTEM

The illumination system by means of which a selected portion of the area of the mask is illuminated is illustrated in FIG. 5; it includes a light source provided by a mercury capillary lamp 502 of arcuate shape, a concave primary mirror 504 apertured at 506, and a convex secondary mirror 508 supported on a plate 510 of suitably transparent material capable of passing both the visible and ultraviolet light produced by the lamp 502.

An arcuate image of the lamp 502 is formed by the mirrors 504 and 508 and transferred by a plane mirror 511 to the plane of an arcuate slit 512 which is disposed between field lenses 514 and 516. These lenses are segments of planoconvex spherical lenses. The illumination system is so disposed that the illuminated slit at 512, as reimaged by plane mirrors 513 and 515 and by a spherical mirror 518, appears in the plane of the mask which is on mask stage 222. An arcuate area of the mask thus illuminated is indicated at 223, and this arcuate area 223 is in fixed position relative to the image-forming system 110. The system 110, shown in FIG. 1 and further described below, includes a primary concave mirror 111, a convex secondary mirror 112, and a combination of plane reflecting mirrors, generally indicated at 113, and the illuminated arcuate area 223 on the mask constitutes an extra axial object for the image-forming system 110 in accordance with the teaching of above-noted U.S. Pat. No. 3,748,015. In accordance with the teaching of the patent the system 110 possesses optimum correction for the extra axial object at 223.

To permit accurate adjustment in the position of the wafer without exposing it photographically, there is provided a filter 520 removably insertable into the light path by the operator with the aid of a control on the front panel 750. When inserted into the light path as shown in FIG. 5, this filter prevents the ultraviolet light which passed through slit 512 from reaching the mirror 518 and mask 222. This filter is removed from the optical path just before carriage motion is initiated, to effect exposure after correct positioning of the mask and wafer.

For positioning of the mask and for coarse positioning of the wafer (by mechanism described in the above-mentioned copending parent application) illumination is desired over substantially the entire surface of the wafer and of the mask rather than at a narrow arcuate shaped portion of that surface. For this purpose, there is provided a movable opaque mirror 522 which is similarly under control of the operator to be removably interposed in the light path downstream of the slit 512. A lamp 524, generating little or no ultraviolet radiation to which the wafer would be actinically responsive, is disposed in position to illuminate the mask, with the aid of a condensing lens 525, when the mirror 522 is in the position shown for it in FIG. 5.

IMAGE-FORMING OPTICAL SYSTEM

The imaging of the mask 222 at the wafer 262 is illustrated in FIG. 3. The mask 222 as a whole (when broadly illuminated by the lamp 524 of FIG. 5) or a narrow arcuate slit-shaped area 223 thereof defined by the illuminating system proper, is imaged on the surface of the wafer 262 nearest it with the help of the image-forming optical system 110. This system, as already noted, consists of a primary concave mirror 111, a secondary convex mirror 112, and a mirror array 113 advantageously constructed in accordance with the teaching of U.S. Pat. No. 3,748,105. The mirrors 111 and 112 are concentric, and the secondary mirror 112 is advantageously given a radius of curvature slightly greater than one-half the radius of curvature of the mirror 111, so as to achieve high quality imagery over an extra-axial zone, with which the illuminated slit-shaped area 223 is caused to coincide. The array 113 may be made from three blocks of glass 120, 122 and 124, suitably shaped and assembled. The array is provided with a reflecting face (provided by a plate 701) adjacent the mask 222; the plane of this face is identified in FIG. 3 by the intersecting edges 114 and 115 and is inclined at 45° to the selected common axis of symmetry 118 of mirrors 111 and 112.

For reasons to be explained in connection with FIG. 4, the reflecting face (plate 701) is a dichroic coating of high reflectivity in the ultraviolet, and of approximately 50% reflection and 50% transmission in the visible, formed on a thin glass plate 701 which is affixed to the block 120. The block is cut away under the plate 701, as indicated at 724, for purposes pertaining to the fine viewing system to be described in conjunction with FIG. 4.

By reflection at the face of plate 701, light from the mask 222 is reflected onto the primary mirror 111, whence it is reflected to the secondary mirror 112, back to the primary mirror 111, and thence once more to the array 113. To achieve on the wafer 262 an image of the mask having the same orientation to the mask itself as that which characterizes the orientation of a photographic print to the photographic negative from which the print is made in a contact print, the array 113 is provided with a pair of mutually perpendicular reflecting plane faces 116 and 117. The faces 116 and 117 constitute a "roof," in the terminology of prisms, and the line of intersection of the roof surfaces is perpendicular to the plane face of plate 701 defined by the edges 114 and 115. The "roof" is angularly disposed so that this line of intersection is also inclined at 45° to the axis 118. Faces 116 and 117 may be fully mirrored.

Mirrors 111 and 112 may be spherical. The combination of concave mirror 111 and convex mirror 112 provides a unity magnification optical system. For objects optically distant from the mirror 111 substantially by the radius of curvature thereof, the optical distance from the mirror 111 to the image position is then likewise substantially equal to that radius of curvature. In accordance with the teaching of U.S. Pat. No. 3,748,015 the combination of mirrors 111 and 112 is worked at unity magnification but off-axis, to permit separation of image and object, and also to achieve improved image quality within an annular extra-axial zone. Consequently, in presently preferred embodiments of the apparatus of the present invention the object and image focal planes occupied by the mask 222 and wafer 262 are nominally, except in consequence of deviation of the optical path by reflections at the array 113, in the plane through the common center of curvature of mirrors 111 and 112 which is perpendicular to the axis 118, The array 113 is, therefore, spaced from mirrors 111 and 112 by distances less than their radii of curvature so as to throw the unity magnification conjugate planes of the combination out to opposite sides where the mask 222 and wafer 262 may be located.

Figure 9:
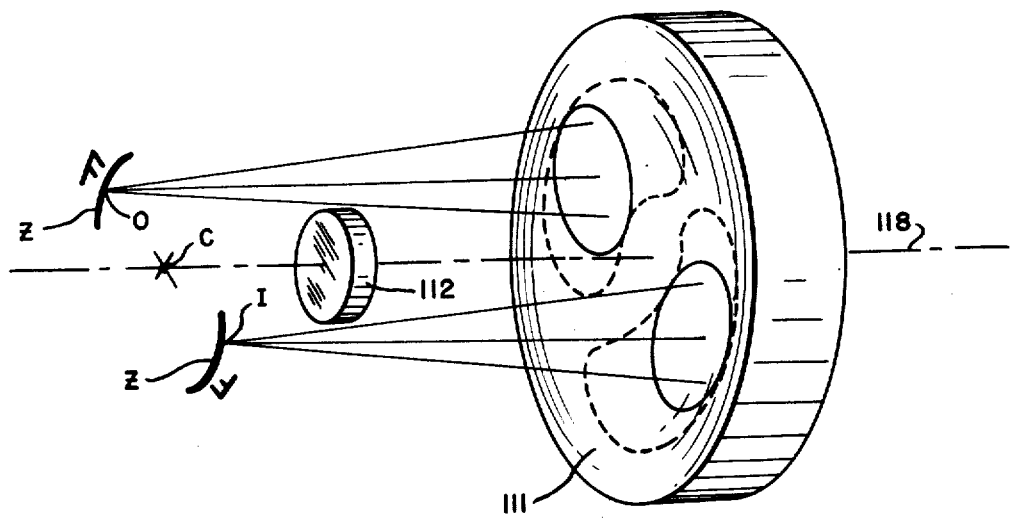
FIGS. 9 and 10 are two diagrams useful in explaining the catoptric projection optical system employed in the invention.
Figure 10:
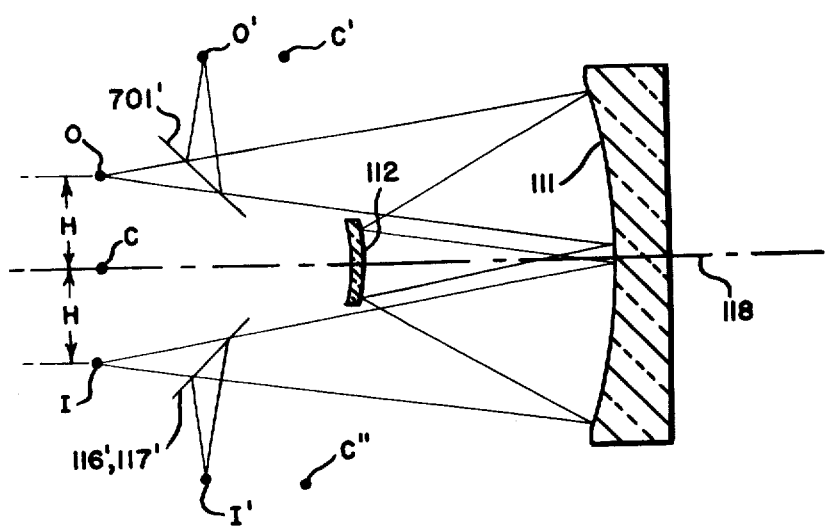

This construction is illustrated in FIGS. 9 and 10. FIG. 9 is a diagrammatic perspective view of the mirrors 111 and 112 alone and FIG. 10 is a sectional view of those mirrors in a plane containing their common center of curvature C, with a simplified representation of the mirror array 113. In both figures, 0 is an object point distant from the mirror 111 substantially by its radius of curvature R, and I is the image of O as successively formed by the mirror 111, by the mirror 112, and by the mirror 111 a second time. The object and image points O and I lie in a plane passing through the center of curvature C, and the perpendicular to this plane through C is the axis 118 of FIGS. 3 and 4. O and I are both distant from C by a distance which may be called H. In FIG. 9 there have been drawn arcuate lines Z of radius H in the plane containing O, and I which, as previously mentioned, is perpendicular to the axis 118. In accordance with the disclosure of U.S. Pat. No. 3,748,015, improved imagery is achieved in the combination of mirrors 111 and 112 for object points optically distant from the axis 118 by the distance H by giving to the convex reflecting surface of the mirror 112 a radius which is approximately $R/2 + H^2/4R$, R being, as before, the radius of curvature of the concave spherical reflecting surface of the mirror 111. This relation is desirably incorporated into the sizing of mirrors 111 and 112 in the machine of the invention. In other words, if the mean radius of the arcuate area 223 in FIG. 3 is H, and if the radius of mirror 111 is R, the radius of mirror 112 is $R/2 + H^2/4R$. In FIG. 10 the plane reflecting mirror formed by the plate 701 of FIGS. 3 and 4 is schematically indicated at 701', and the combination of the plane reflecting faces 116 and 117 is indicated at 116', 117'. The image of the object point O in the mirror 701' is indicated at O', and the image in that mirror of the center of curvature C is indicated at C'. The image of the image point I in the mirror combination of the center of curvature C is indicated at C''. The points O' and C' are separated by the distance H, and so are the points I' and C''. In the machine of the invention being described, the illumination system of FIG. 5 and the image-forming system 110 are so coordinated in their dimensions that the means radious H of the arc to which the arcuate illuminated area 223 of FIG. 3 conforms matches at least approximately the dimension H according to which the radius of curvature of the mirror 112 is oversized in accordance with the relation just set forth. The illumination system of FIG. 5 and the image-forming system 110 are moreover positioned with respect to each other so that the center of curvature of the arcuate area 223 coincides at least approximately with the point identified as C' in FIG. 10, this being in the machine the image in the mirror 701 of an object point separated by the distance H from the axis 118 of the system 110. The mask and wafer are caused to lie in planes perpendicular to the plane of FIG. 10 and containing in the case of the mask the points O' and C' of FIG. 10 and in the case of the wafer the points I' and C'' of FIG. 10.

With the construction of the system 110 and its coordination to the location of the mask and wafer and to the dimensions and location of the arcuate illuminated area 223 which have been described, the apparatus provides at the plane of the wafer 262 away from the reader in FIG. 3, a high quality image at unity magnification of an object lying in the face of the mask 222 near the reader in FIG. 3. More particularly, such a high quality unity magnification image is provided for an object lying within the extra-axial arcuate area indicated at 223 on that surface of the mask in accordance with the disclosure of the aforementioned U.S. Pat. No. 3,748,015.

The orientation to each other of the object and image achieved in this imaging system 110 with the help of the "roof" faces 116 and 117 is indicated in FIG. 3 by the application of the upper case letter F to the near face of the mask 220 and to the far face of the wafer 262. This is the contact print orientation above referred to; it has the advantages that it is compatible with the arcuate rotational motion which the carriage imposes on the mask and wafer, and that it is compatible with the other processes or process steps employing contact printing.

After the mask and wafer have been properly positioned with respect to each other in the carriage, with the aid of the coarse and find viewing systems, described below, the operator of the machine of FIG. 1 programs the machine for an exposure, with the aid of one of the controls on the panel 750. This shifts the carriage 200 to one end of its travel, drawing the mask and wafer respectively out of the illuminated area 223 of FIG. 5 and out of the image of that area produced by the imaging system 110. The lamp 524 of FIG. 5 is shut off and the filter 520 and mirror 522 are removed. The carriage then rotates through its travel, exposing successive portions of the mask to illumination over the stationary arc-shaped area 223 and thereby exposing successive portions of the wafer to the image of those successively illuminated portions of the mask.

COURSE AND FINE VIEWING SYSTEMS

In order properly to position the maks and wafer with respect to each other in the carriage by operation of the positioning mechanisms, which are described in copending patent application Ser. No. 339,860, it must be possible to observe the mask and wafer alignments. The mask is observed by observation of the image thereof projected by the optical system 110 onto the surface of the wafer. This image, and the wafer itself, are observed by means of coarse and fine viewing systems.

The coarse viewing system provides a view of the image of the entire mask and of the entire wafer at once, or at least of a major fraction of each, and is illustrated in FIG. 3. The image of the mask at the wafer produced by the image system 110 (ie. by reflecting face of plate 701, by the mirrors 111 and 112 and by the reflecting faces 116 and 117) and also the wafer itself, are examined with the aid of an optical system which comprises successively the roof surfaces 116 and 117, the primary mirror 111, three sets of relay lenses 651, 652 and 653, and finally the binocular eyepiece 600 together with the plane mirrors 654, 655 and 656 and a number of additional elements to be mentioned presently. To permit functioning of the coarse viewing system, the secondary mirror 112 of the unitary magnification imaging system 110 is provided on its convex surface adjacent to the mirror 111 with a dichroic coating having a high reflectivity in the ultraviolet and, desirably, a reflectivity of some 50% and a transmission of some 50% in the visible. A prism 658 is included to fold and shorten the light path. A derotating prism 657 is inserted to permit presentation of the image to the observer in a suitably oriented azimuthal position. To permit illumination of the wafer in a color contrasting with that in which the image of the mask is presented by the lamp 524 of FIG. 5 and any filter which may be associated with it, a lamp 659 with an associated condensing lens 659' and filter 659'' is positioned to illuminate a prism 660 attached to the prism 658 and having a beam-splitting surface therein. Light from the lamp 659 thus passes successively to the relay lens combinations 652 and 651, through the mirror 112 and to the mirror 111, and thence via reflecting faces 116 and 117 to illuminate the wafer 262.

The binocular eyepiece may be of variable magnification type, with a zoom control 601.

The mirror 522 of FIG. 5 may be made thin partially transparent enough to permit some light from the source 502, filtered at 520 and refocused by the mirror 518, to pass it. The area 223 on the mask will then be illuminated more brightly than the remainder of the mask, and a corresponding bright arcuate area 223' will appear on the wafer.

Figure 4:
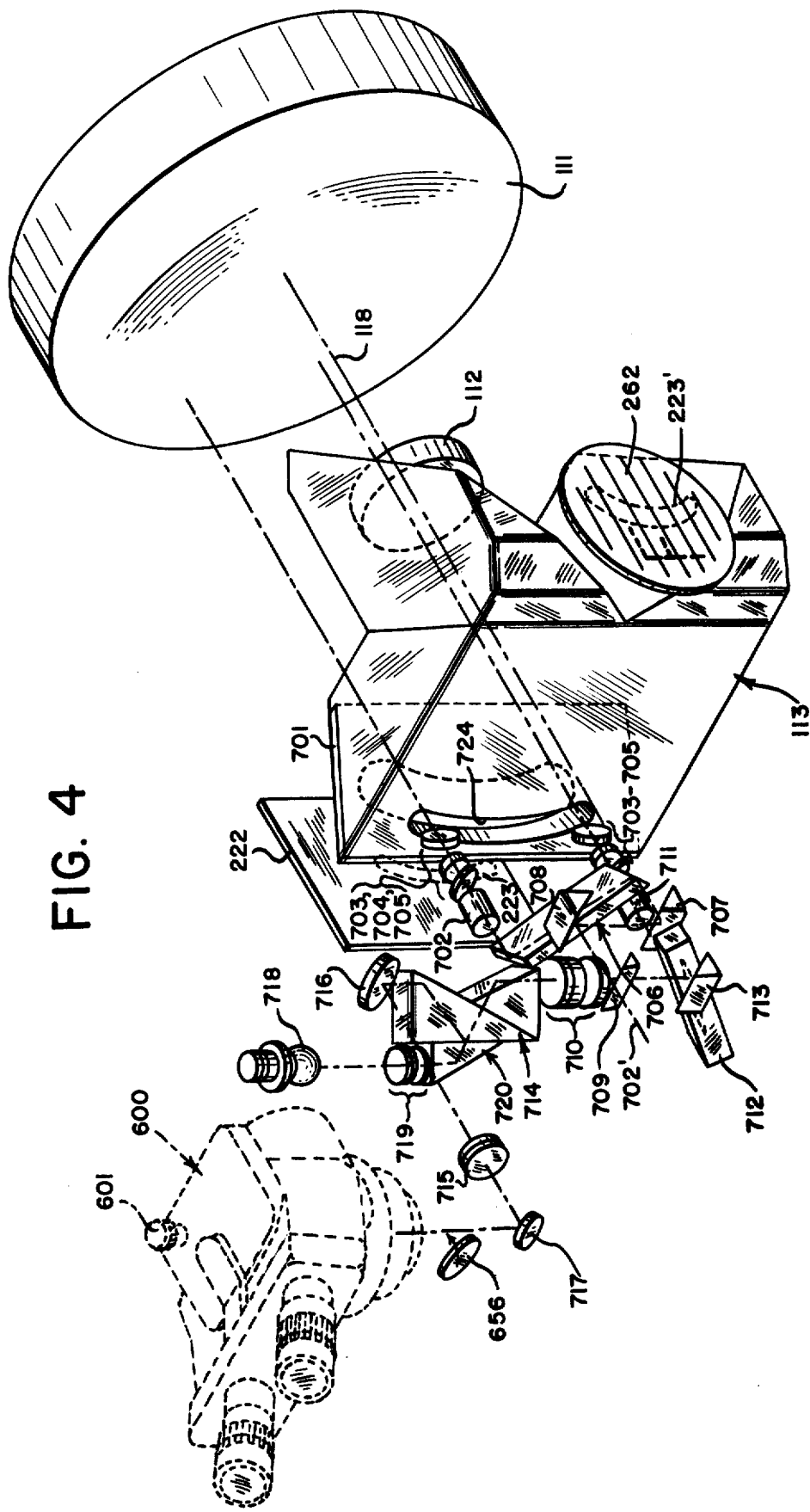
FIG. 4 is a view similar to that of FIG. 3, but showing instead of the coarse viewing system the fine viewing system by means of which the mask and wafer are accurately positioned with respect to each other in the carriage.

For viewing of fine detail in the mask image at the wafer and in the wafer itself, there is provided a fine viewing system illustrated in FIG. 4. The image of the mask at the wafer 262 and the wafer 222 itself considered as objects (and more particularly the portions of those objects lying within the area 223' on the wafer, which area is itself the image on the wafer of the illuminated area 223 on the mask), are reimaged backward successively at the reflecting faces 116, 117, mirror 111, mirror 112 and mirror 111 again. Selected portions of the resulting aerial image are examined with the aid of two movable microscope objectives in conjunction with the eyepiece 600. Instead, however, of examining such an aerial image in the plane of the mask itself, there is examined the aerial image formed by the fraction of the backwardly travelling light from the mirror 111 which passes through the plane reflector 701. More particularly, two microscopes permit examination of two portions controllably spaced along the arcuate area 223' on the surface of the wafer away from the reader in FIG. 4.

For this purpose, the glass block 113 has cut therethrough an arcuate slot 724, extending substantially parallel to the axis 118 from the near face of the block in FIG. 4 to the face of the block on which the plate 701 is affixed. The aerial image of interest of the area 223' is arcuate in shape, with its center of curvature substantially on the axis 118, lies substantially in a plane perpendicular to that axis and is near the opening of aperture 724 at the near face 120 of glass Two microscope objectives 702 and 711 (FIG. 4) are provided, supported on arms (not shown) which are pivoted substantially on the axis 118 and of such length as to align those objectives with the arcuate slot 724. Supported with each objective 702, 711 are three plates 703, 704 and 705, suitably tilted about the axis of the objective to compensate for the aberrations introduced into the image presented to that objective by the convergent passage through the tilted plate 701 of light on its way to formation of the image. Supported near the objective 702 on its arm is a prism 706 to bring the axis of objective 702 down to the axis 118. After two reflections in prism 706 and two further reflections at stationary path folding mirrors 707 and 708, the image of the fraction of the object 223' at the wafer selected by objective 702 is formed in the vicinity of a further plane mirror 709. Mirror 709 selects half of this image and diverts it into one-half of the field of a field lens 710.

The second objective 711 with associated tilt-plate 703, 704 and 705, and a prism 712 movably mounted on the second arm bring to the axis 118 light representative of another selected part of the area 223'. This light is deviated at a fixed mirror 713 into the other half of the fields lens combination 710.

The objectives 702 and 711 thus each contribute an image of a semi-circular area along the arcuate object 223'. The two half fields so combined are presented to the operator in the eyepiece 600, after passage through an azimuthal angle selecting prism 714, a relay lens 715, and deviation at mirrors 716 and 717. A lamp 718 and associated lens and filter combination 719 and combining prism 720 make it possible to illuminate the semi-circular areas on the wafer, along the length of the area 223', in a visible color contrasting with that of the lamp 502 and filter 520 of FIG. 5.

It is to be understood that the instrument of FIG. 1 includes the components of both of FIGS. 3 and 4. Those figures both show the imaging system 110, the mask 220 and the wafer 262, and also the eyepiece 600. FIG. 3 shows further the additional elements which, with the system 110 and eyepiece 600, make up the coarse viewing system for examination of the wafer and of the image of the mask cast upon the wafer by the system 110 itself. FIG. 4 shows further the additional elements which, with the system 110 and eyepiece 600, make up the fine viewing system for examining selected portions of the wafer and of the image of the mask so cast upon it. Selections between the coarse and fine viewing systems is made with the mirror 656, which is movable and which is shown in both of FIGS. 3 and 4. It is disposed, as seen in FIG. 4, between the mirror 717 of the fine viewing system and the eyepiece 600. When mirror 656 is inserted into the path for light entering the eyepiece, the coarse viewing system is optically completed and the fine viewing system is disabled.

The mirror array provided by glass block A 113 must be susceptible of closely controlled positional adjustments in order to permit achievement in the completed machine of correct alignment of that array with the pivot axis 210. For this purpose, the array is supported from the pedestal 100 of FIG. 1 in the manner illustrated in FIG. 6. The head 102 of the pedestal includes a plate 130, shown in FIG. 1, oriented vertically and perpendicular to the axis 118. The mirror array 113 is affixed to a plate 131 (FIG. 6), parallel to plate 130, by three flexure links 132, 133 and 134 which accommodate the different thermal expansions and contractions of the array and plate. The plate 131 in turn is coupled to the plate 130 by means which permit small closely controlled motions of the plate 131 and hence of the array 113 with respect to the plate 130 and hence with respect to the head 102 of pedestal 100 in which the mirrors 111 and 112 are fixedly mounted, by means not shown.

These coupling means include two fixture links 135 and 136 at right angles to each other, connected between short brackets 137 attached to plate 131 and struts 138 affixed to plate 130. Links 135 and 136 limit rotations of the plate 131 in its own plane to rotations about the point of intersection C of those links in FIG. 6, on or near the axis 118 of FIGS. 3 and 4. The construction is such that this point C is located approximately at the common center of curvature of the mirrors 111 and 112.

The coupling means additionally include two flexure links 139 and 140 disposed substantially in a vertical plane containing the axis 118, links 139 and 140 being respectively above the below the axis. Link 139 is fastened at one end to plate 130 and at the other end to the plate 131 through an adjustable flexure device 141. Link 140 is fastened at one end to plate 130 and at the other end to plate 131 through a fixed bracket 142.

The coupling means further include a flexure link 143 at the lower end of plate 131 fastened at one end to plate 130 via a strut 146 and at the other end to plate 131 through an adjustable flexure device 145.

The coupling means lastly include a flexure link 146, fastened at one end to plate 130 and at the other end to plate 131 through an adjustable flexure device 147. The link 146 is horizontally displaced from the vertical line in which links 139 and 140 are disposed.

Figure 6:
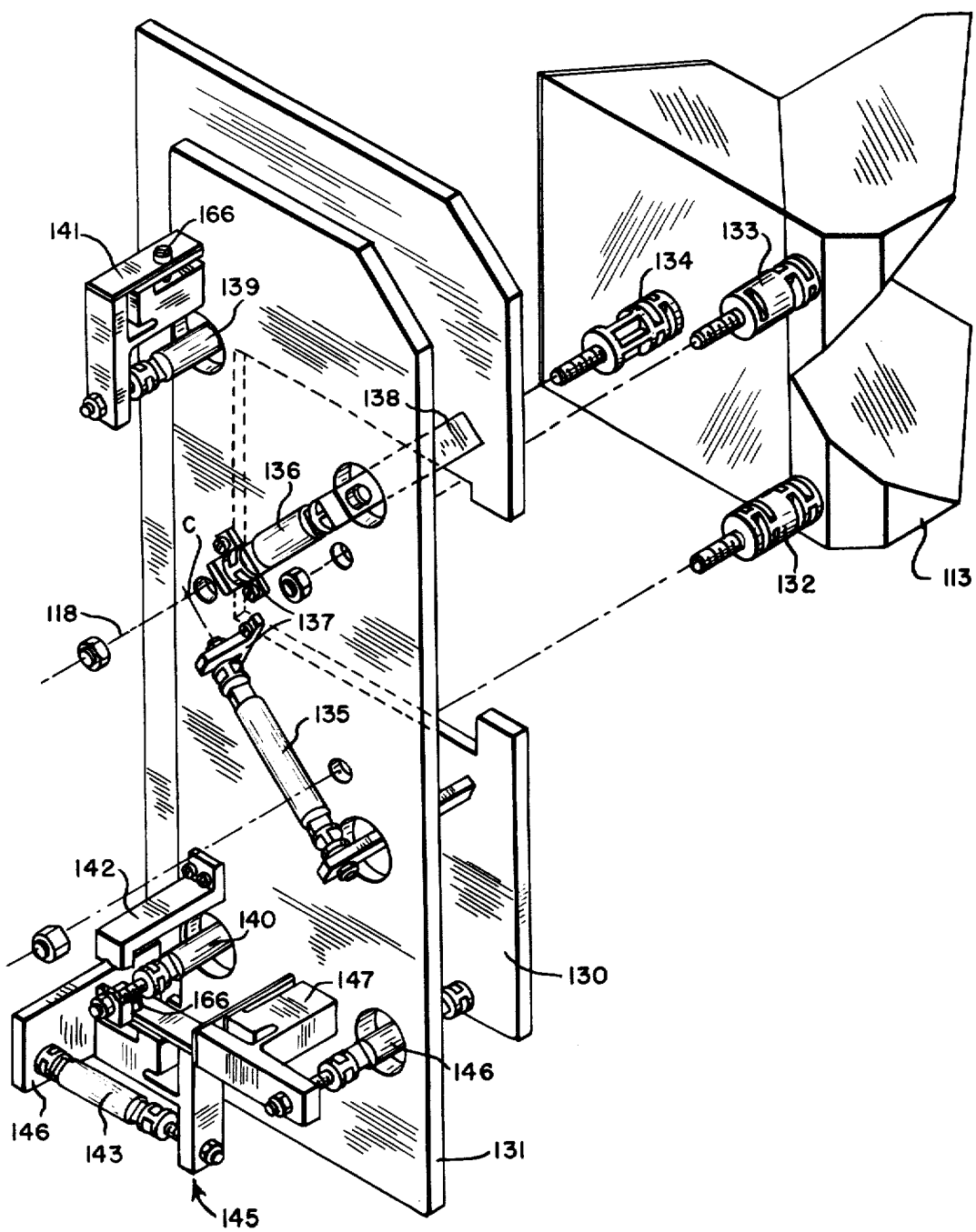
FIG. 6 is a diagrammatic view of a preferred mechanism for adjustable stationary support of a mirror array forming part of the catoptric projection optical system.
Figure 7:
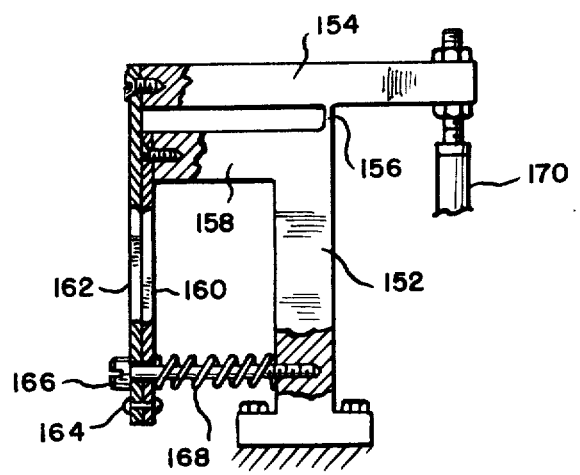
FIG. 7 is a view of a flexure device for imposing minute motions used in the apparatus of FIG. 6.

The adjustable flexure devices 141, 145 and 147 are of the type illustrated in FIG. 7, and permit closely controlled minute backlash free motions. Adjustment of the device 145 at its screw 166 rotates the plate 131 in its own plane about a center substantially on the axis 118. Adjustment of the device 147 at a similar screw not visible in FIG. 6 rotates plate 131 about a vertical axis in or near the plate and passing through or near the links 139 and 140. Adjustment of devices 145 and 147 constitute two adjustments which are orthogonal, i.e. noninterferring, and which are required to make parallel to the axis of rotation 210 of the carriage (FIG. 8) lines joining conjugate object and image points in the mask 222 and wafer 262. Since the two rotations produced by adjustment of the flexure devices 145 and 147 are both about the center of curvature C, neither causes a change in focus. The third adjustment, of device 141, causes an arcuate translation of the array 113 and thereby adjusts the focus, i.e. the length of the optical path from ask to wafer via the system 110, of which the array 113 is a part.

As seen in FIG. 7, each of the flexure devices 141, 145 and 147 include a stem 152 to which a lever 154 is connected through a flexure joint 156. The stem 152 has affixed thereto an arm 158, extending transverse of the stem and parallel to the lever 154. A first flexure blade 160 is affixed to the arm 158, extending parallel to the stem 152. A second flexure blade 162 overlies the blade 160. The blade 162 is connected at one end to one end of the lever 154 and is bound at the other end as by a rivet 164 to the blade 160. A screw 166 passes with clearance through the blades 160 and 162, and is threaded into the stem 152. A compression helical spring 168 is engaged about the screw 166 between the stem 152 and the blade 160.

The blade 160, when the screw 166 is turned in, is pinned to the arm 158 of the stem. Adjustment of the screw 166 imposes a varying curvature on the blades 160 and 162, with the blade 162 having a greater or lesser radius of curvature than the blade 160 according as the screw 166 is advanced to the right or left as seen in FIG. 7. Since the two are pinned together at the lower end in FIG. 7, the blade 162 will slide at its upper end by a minute amount relative to blade 160, and this motion is transferred by the beam 154 to an output, indicated in FIG. 7 as a link 170. As shown in FIG. 6 the stems (152 in FIG. 7) of the flexure devices 141, 145 and 147 are affixed to plate 131.

OPERATION

In the operation of the machine, a mask is loaded onto the mask stage 220 with the aid of the mechanism 450 (FIG. 1) and a wafer 262 is loaded manually onto the platen and platen carrier 309 in the loading mechanism 400, which mechanism is accessible to the operator. By operation of a control on the front panel 750, the loaded platen and platen carrier are then transferred from the mechansim 400 to the wafer stage 260 in the carriage.

With the carriage in a central position of its angular travel, the coarse viewing system is activated by insertion of mirror 522 and lighting of lamp 524 in FIG. 5, and by insertion into the optical path of the eyepiece of the mirror 656 in FIG. 3. The linear and angular motion controls on the front panel are then operated for actuating mechanisms that are described in the earlier noted copending patent application Ser. No. 339,860 to correctly align the mask. In the eyepiece 600 the operator sees at one level of illumination either the image of the whole mask on the wafer or, in any event, most of it. Superimposed thereon he sees at a higher level of illumination he sees two semi-circular or "D-shaped" areas which are spaced along the length of the arcuate area 223 according to the angular position of the microscope objectives can be adjusted angularly about this axis with the aid of a front panel control, and for this initial alignment they are desirably positioned near the ends of their travel, as they are shown in FIG. 4. The operator manipulates controls of mask stage alignment mechanism (not shown) to position within each of the D-shaped areas at least one of a number of alignment marks which are distributed over the surface of the mask.

The operator may make preliminary adjustments on wafer position while viewing the surface of the wafer through the coarse viewing system of FIG. 3. He then changes over the fine viewing mechanism of FIG. 4 and further adjusts the wafer position in X, Y and O motions, so as to achieve accurate alignment of the mask alignment marks previously set with corresponding alignment marks on the wafer and which are seen one in each of the two semi-circular fields simultaneously presented to him at the eyepiece 600.

By operation of a further front panel control, the carriage is rotated to a start position at which the mask and wafer are withdrawn outside the illuminated areas 223 at the mask plane and 223' at the wafer plane. The filter 520 and mirror 522 then withdrawn from the optical path of FIG. 5 and the carriage is rotated to carry or "scan" the mask and wafer across illuminated areas 223 and 223', the direction of scan being transverse to the length of those areas.

The machine may incorporate structure for insuring that the foregoing steps are performed in the correct order and with any convenient degree of automation compatible with the requirements for correct positioning of the mask and wafer.

It will thus be seen that the invention provides apparatus for photography exposing an image-receiving surface (a wafer) to a light image of an object (a mask). The apparatus comprises a concave mirror 111, a convex mirror 112 of smaller radius of curvature with its center of curvature substantially at the center of curvature of the concave mirror, and separate stages to support substantially plane object and image surfaces (the mask and wafer) optically disposed in a common plane containing that center of curvature. This is set forth in connection with FIGS. 9 and 10. From those figures it will be seen that the mask and wafer occupy planes which are images, in the mirror 701' and in the mirrors 116' and 117' respectively, of a plane containing the center of curvature C of the concave and convex mirrors, an object point 0 distant from the concave mirror substantially by the radius of curvature of the latter, and containing also the image I of that object point in the concave and convex mirrors. The mask and wafer are, therefore, disposed optically, although not physically (in the embodiment shown in the drawings) in the plane containing the arcuate lines Z of FIG. 9, which last-mentioned plane contains the center of curvature C and is perpendicular to the axis 118. The apparatus of the invention also includes, in the illumination system of FIG. 5, apparatus to illuminate in the plane of the object surface (ie. of the mask) an arcuate area 223 which is exterior to and substantially centered on the axis 118 as produced (by reflection at mirror 701) to the mask plane. Lastly, in its broadest aspects, the apparatus of the invention includes means, such as the carriage 200, to advance the object (the mask) in its plane through that illuminated arcuate area and to advance the image-receiving surface (the wafer) in its plane through the image of that illuminated arcuate area. These means may, of course, move the mask and wafer with respect to the mirrors 111 and 112, or alternatively the mirrors 111 and 112 (with the mirror array 113, in the embodiment illustrated) and the illuminating system 500 may be moved with respect to the mask and wafer to effect such advance.

In the presently preferred embodiment which has been illustrated and described, the apparatus of the invention further includes, in the reflecting array 133, two plane reflecting means which are positioned between the concave and convex mirrors 111 and 112 and their center of curvature. In the embodiment illustrated, one of these plane reflecting means takes the form of the mirror 701 and the other takes the form of the plane mirrors 116 and 117 together. These two reflecting means are inclined to each other at substantially 90° and each is inclined to the axis 118 at substantially 45°. In consequence of this construction and disposition of the mirror array 113, the unity magnification conjugate object and image planes in which the wafer and mask are disposed are parallel to each other and to the axis 118.

According to a further feature of the invention, the mirror array 113 includes, as the second of these two plane reflecting means, the two perpendicular plane mirrors 116 and 117 instead of a single plane mirror matching the mirror 701. The plane mirrors 116 and 117 are inclined to each other at 90°. They are equally inclined to the mirror 701, and their line of intersection is inclined at 45° to the axis 118. In fact, the planes of the mirrors 116 and 117 are each inclined at 30° to the axis 118.

Provision of the "roof" mirrors 116 and 117, and the consequent inversion top for bottom of the mask image as formed at the wafer plane, permits the use according to a preferred embodiment of the invention of a carriage for the mask and wafer which is pivoted about an axis (210 in FIG. 8) fixed with respect to the optical system 110. Hence the mask and wafer undergo arcuate motion in their travel through the unity magnification conjugate planes of the system 110.

According to still another feature of the invention, one of the plane reflecting means by which the mask and wafer planes are thrown out into parallelism with each other as indicated in FIG. 10 instead of lying in a common plane as indicated at the arcuate lines Z in FIG. 9, is made partially transparent. This is the case for the mirror 701 in the embodiment illustrated. According to this feature, there are then additionally provided means to examine the image of the wafer surface produced by the concave mirrors as that image is transmitted through the partially transparent mirror 701. These means for examination take the form, in the embodiment illustrated, of the fine viewing mechanism illustrated in FIG. 4 and described in conjunction with that figure. In a preferred embodiment, namely that which has been described and illustrated, these viewing means comprise separate microscope objectives 702 and 711 supported for arcuate motions about the axis 118, and a common eyepiece 600. Further, a periscope is coupled to each of these objectives to render the optical axis of the objective collinear with the axis 118. Field splitting and combining means such as the mirrors 707, 708, 709 and 713 then present in the eyepiece one half of the field from each objective. In the embodiment illustrated, these periscopes take the form of the prisms 706 and 712. Inclusion of these periscopes has the high advantageous result that the images presented by the microscopes (as viewed with the eyepiece 600) do not undergo rotation as the microscopes undergo arcuate motion about the axis 118 along the length of the opening 724 in FIG. 4 of the drawings.

According to another feature of the invention, means are provided to examine the image surface, i.e. the wafer, as imaged in the concave mirror. These comprise in FIG. 3 the eyepiece 600 together with the relay lenses 651, 652 and 653, which are enabled to co-act with the concave mirror 111 by virtue of the fact that the convex mirror 112 is partially transparent.

While the invention has been hereinabove described in terms of a presently preferred embodiment, the invention is not limited to the structure illustrated and described. Among the many alternative construction which fall within the scope of the invention as understood by the applicants and as sought to be set forth in at least the broader of the appended claims, there may be mentioned the fact that the roof mirrors 116 and 117 may be replaced by a single plane mirror, at least if a rectilinearly moving carriage is employed. Neither is the invention limited to the use of a convex mirror whose radius is equal or substantially equal to one-half the radius of the concave mirror. Other combinations of concave and convex mirrors may be employed, preferably, however, those in which the algebraic sum of the powers of the reflective surfaces as utilized is zero. In the embodiment illustrated, this condition is fulfilled for a 2:1 ratio for the radii of curvature of the mirrors 111 and 112, since the image of the mask at the wafer is the result of one reflection of the mirror 112 and of two reflections at the mirror 111. With the convex mirror having a radius of curvature equal or substantially equal to two-thirds the radius of curvature of the concave mirror, the same result can be achieved by providing for three reflections at the concave mirror and two reflections at the convex mirror. With such an embodiment as with the embodiment which has been illustrated and described, the radius of curvature of the convex mirror is increased by a small amount above the value of two-thirds of the radius of the concave mirror in order to obtain optimum image quality for an extra-axial object position, i.e. for the position of the arcuate object area 223 hereinabove identified.

More generally, the invention comprehends all modifications of and departures from the construction hereinabove illustrated and described, properly falling within the spirit and scope and the appended claims.

What is claimed is:

1. Apparatus for photographically exposing an image-receiving surface to a light image of an object, said apparatus comprising:

a concave mirror, a convex mirror of smaller radius of curvature with its center of curvature substantially at the center of curvature of the concave mirror, means for supporting an object surface and an image-receiving surface with respect to each other and with respect to said mirrors so as to optically define a common image and optical plane, said optically defined common image and optical plane being located a distance from the concave mirror substantially equal to the radius of curvature thereof, said optically defined common image and optical plane containing the centers of curvature of said mirrors, and the perpendicular to the optically defined common image and optical plane through said centers of curvature constituting an axis of said mirrors, means for illuminating an arcuate area at the site of the object surface which forms an arcuate light image area at the site of the image receiving surface, said arcuate area at the site of the object surface and said arcuate light image area at the site of the image-receiving surface optically defining, on the optically defined common image and optical plane, arcuate images respectively having arcuate areas exterior of and substantially centered on said axis of the mirrors, and means to advance said support means and the sites of the object and image-receiving surfaces to be supported thereon in their planes transversely of the means for illuminating the arcuate area on the object surface, said advancing means comprising a carriage rotatable about an axis fixed with respect to said concave and convex mirrors.

2. Apparatus according to claim 1 including two plane reflecting means positioned between said mirrors and their centers of curvature, said reflecting means being inclined to each other and to said axis and being positioned to dispose said sites of the object and image receiving surfaces on said support means parallel to each other and to the axis of said mirrors.

3. Apparatus according to claim 2 wherein one of said plane reflecting means includes a single plane mirror and wherein the other of said plane reflecting means includes a pair of plane mirrors inclined to each other to form a line of intersection, said line of intersection being disposed in perpendicular relationship with respect to the plane of said single plane mirror.

4. Apparatus according to claim 3 wherein said plane mirrors are incorporated in a single rigid array.

5. Apparatus according to claim 3 wherein said pair of plane mirrors have mutually perpendicular reflecting plane faces, and wherein said line of intersection is inclined at substantially 45° with respect to said axis of the mirrors.

6. Apparatus according to claim 2 wherein one of said plane reflecting means is partially transparent, and which includes means to examine the image of an image receiving surface on said support means produced by said concave and convex mirrors and transmitted through said partially transparent reflecting means.

7. Apparatus according to claim 6 wherein said examining means comprises two microscope objectives supported for arcuate motions about said axis of said concave and convex mirrors, prisms coupled respectively to each of said objectives to bring the axes of said objectives to be substantially collinear with said first mentioned axis, and means to present in a common eyepiece one half of the field of each of said objectives.

8. Apparatus according to claim 2 wherein the radius of curvature of the convex mirror is substantially equal to one-half the radius of curvature of the concave mirror increased by the square of the mean radius of the illuminated arcuate area at the site of the object surface divided by four times the radius of curvature of the concave mirror.

* * * * *